(12) United States Patent
Francis et al.

(10) Patent No.: US 6,198,115 B1
(45) Date of Patent: Mar. 6, 2001

(54) IGBT WITH REDUCED FORWARD VOLTAGE DROP AND REDUCED SWITCHING LOSS

(75) Inventors: Richard Francis, Manhattan Beach, CA (US); Perry L. Merrill, Globe, AZ (US)

(73) Assignee: International Rectifier Corp., El Segundo, CA (US)

(*) Notice: Subject to any disclaimer, the term of this patent is extended or adjusted under 35 U.S.C. 154(b) by 0 days.

(21) Appl. No.: 09/479,185

(22) Filed: Jan. 7, 2000

Related U.S. Application Data

(62) Division of application No. 08/897,248, filed on Jul. 18, 1997, now Pat. No. 6,043,112.
(60) Provisional application No. 60/022,599, filed on Jul. 25, 1996.

(51) Int. Cl.[7] .............................. H01L 29/74; H01L 31/111
(52) U.S. Cl. .............................. 257/144; 257/339; 257/590; 257/611; 257/617

(58) Field of Search .............................. 438/143, 471, 438/473, 511, 543, 752, 933; 257/558, 590, 611, 613, 616, 617, 913, 144, 145, 339, 342

(56) References Cited

U.S. PATENT DOCUMENTS

| | | | |
|---|---|---|---|
| 5,661,314 | * | 8/1997 | Merrill et al. .............................. 257/144 |
| 5,766,966 | * | 6/1998 | Ng .............................. 438/138 |
| 6,008,092 | * | 12/1999 | Gould .............................. 438/268 |

* cited by examiner

Primary Examiner—Olik Chaudhuri
Assistant Examiner—Hoai Pham
(74) Attorney, Agent, or Firm—Ostrolenk, Faber, Gerb & Soffen, LLP

(57) ABSTRACT

The boundary between the P type silicon base and N+ buffer layer of an IGBT is intentionally damaged, as by a germanium implant, to create well defined and located damage sites for reducing lifetime in the silicon.

15 Claims, 1 Drawing Sheet

IGBT WITH REDUCED FORWARD VOLTAGE DROP AND REDUCED SWITCHING LOSS

RELATED APPLICATION

This application is a division of application Ser. No. 08/897,248, filed Jul. 18, 1997, now U.S. Pat. No. 6,043,112 claims the priority of provisional application Ser. No. 60/022,599, filed on Jul. 25, 1996.

FIELD OF THE INVENTION

This invention relates to insulated gate bipolar transistors ("IGBTs")., and more specifically relates to an IGBT structure which has a reduced forward voltage drop, a reduced switching loss, and a process for its manufacture.

BACKGROUND OF THE INVENTION

ICBTs are well known devices having use in numerous switching applications. A typical IGBT and manufacturing process is described in British Patent 2,243,952 (GB IR-988). Two key characteristics of IGBTs are their forward voltage drop and their switching loss, both of which should be as low as possible. Thus, the forward voltage drop of a conventional IGBT formed in a silicon die is about 0.7 volts at the lowest. The switching speed of the device can be increased by the use of lifetime killing techniques such as irradiation, or the use of heavy metal doping, for example, gold and platinum, but this also increases its forward voltage drop.

Preferably, lifetime killing should be confined to the $N^+$ buffer layer of the IGBT junction pattern. Further, it is desirable to have lifetime killing minority collection sites uniformly distributed within a desired predetermined volume within the device crystal lattice.

BRIEF DESCRIPTION OF THE INVENTION

In accordance with a first feature of the invention, the interface between the $P^+$ main body and the $N^+$ buffer layer is intentionally damaged to produce lattice defects or dislocation sites which will selectively and uniformly collect heavy metal atoms such as platinum or gold which is diffused into the IGBT chip. These heavy metal atoms are then more uniformly distributed within some predetermined desired volume to cause a "leaky" junction at the $P^+/N^+$ interface, thus reducing switching loss.

While the lattice can be selectively damaged in various ways, in accordance with a second aspect of the invention, the $N^+$ buffer layer of a monocrystalline silicon chip is formed to contain a small amount (about 1% by weight) of germanium, which has a depth of about 1 to 5 microns. This silicon/germanium $N^+$ region creates, in effect, a uniformly damaged lattice in the $N^+/P^+$ junction area which permits the more uniform collection of and positioning of heavy metal lifetime killing atoms, thus increasing switching speed and reducing switching loss. Further, the use of the germanium in the silicon lattice in the boundary between the $P^+$ collector and the $N^+$ buffer layer lowers the minimum forward voltage drop of the device by approximately 150 mv. It should be noted that it is known to form a Si/Ge layer in an IGBT, as described in Z. Rodzimski et al., IEEE Trans. Electron Div. ED-35, 80 (1988). This however had the purpose of lifetime profiling over device depth and was not known to create a dislocation site to uniformly distribute heavy metal atoms.

DETAILED DESCRIPTION OF THE DRAWINGS

Figure 1:
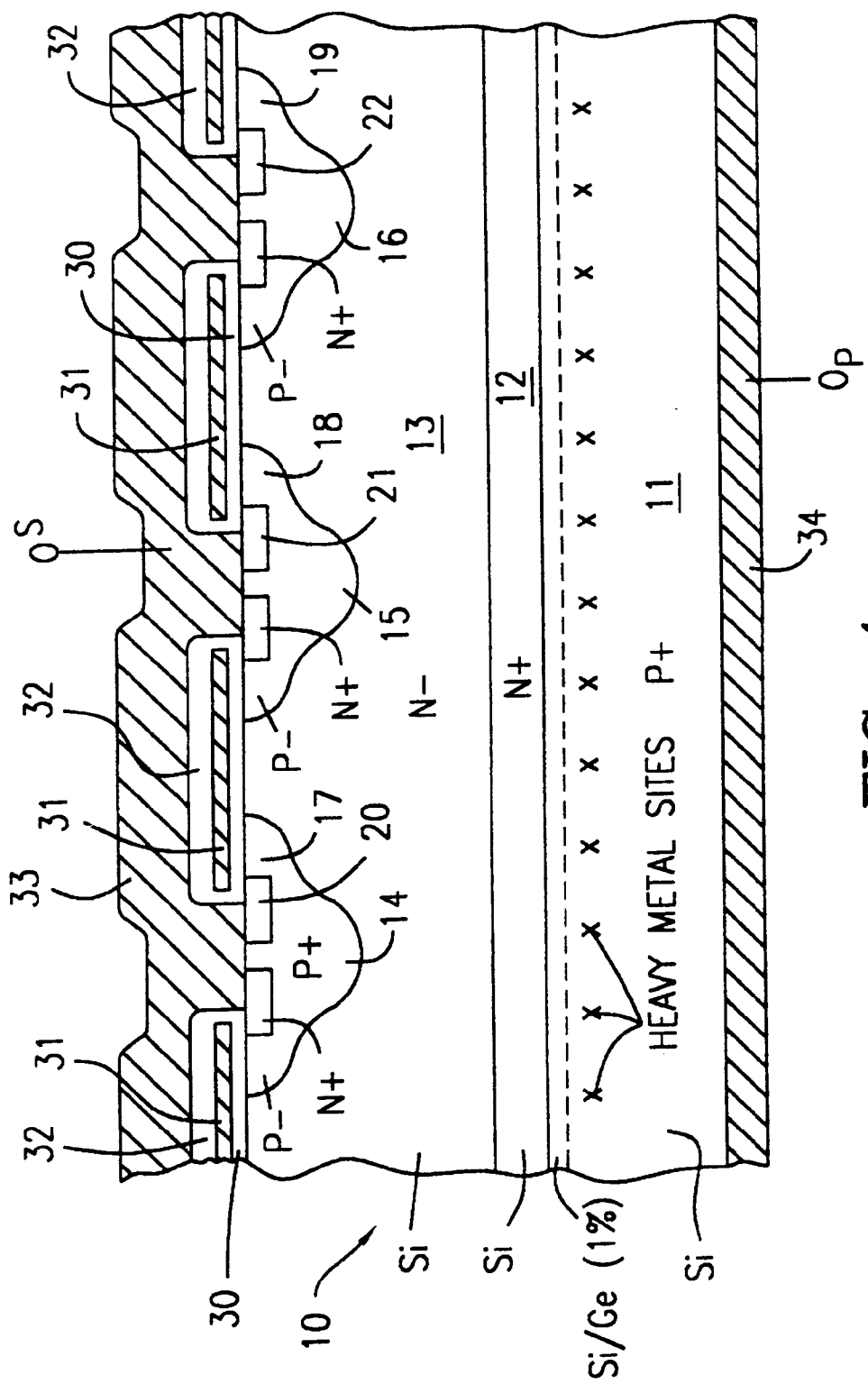
FIG. 1 shows a cross-section of a small portion of an IGST die containing the present invention.

In FIG. 1, there is shown a cross-section of a small portion of a chip 10 of monocrystalline silicon. In the conventional and well-known IGBT, the chip consists of a $P^+$ body region 11, an $N^+$ buffer layer 12, and silicon $N^+$ epitaxially formed junction receiving layer 13. Buffer layer 12 may have a thickness of about 10 microns.

To define the IGBT, a plurality of P type base cells 14, 15 and 16 are diffused into the $N^+$ layer 13. In an actual chip, there can be many thousands of such base cells, which each have a polygonal topology. Other topologies, including interdigitation and parallel base strips could also be used.

Each of P type base cells 14 to 16 may be conventionally formed of a central $P^+$ contact region and $P^-$ annular channel regions 17 to 19 respectively. Each cell also receives annular $N^+$ sources 20 to 22 respectively to define the annular channels 17 to 19. A deep increased N type concentration region (not shown) can be formed in the common conduction region between spaced bases, as described in British Patent 2,243,952.

Each of annular channels 17 to 19 is covered by a portion of a gate oxide mesh 30 which is, in turn, covered by a polysilicon gate mesh 31. The polysilicon is, in turn, covered by a layer of low temperature oxide ("LTO") 32 which insulates gate 31 from an aluminum source electrode 33. A gate terminal G is connected to gate mesh 31. The LTO layer 32 has appropriate windows to enable the source electrode 33 to contact the sources 20 to 22 and the central $P^+$ regions of each of cells 14 to 16 respectively. A suitable drain electrode 34 is then connected to the bottom of $P^+$ region 11.

In order to increase switching speed, the chic or die is commonly E-beam irradiated or is diffused with heavy metal atoms such as gold or platinum to reduce lifetime within the silicon. However, lifetime killing also increases the forward voltage drop of the device.

The above describes any generalized IGBT. In accordance with the invention, the interface between the continuous and monocrystalline silicon $N^+$ buffer 12 and $P^+$ body 11 is intentionally and uniformly damaged. During the manufacturing operation, gold or platinum is then conventionally diffused into the body of chip 10, preferably from the bottom of the chip before the drain electrode 34 is applied, using any of the well known techniques for this purpose. Heavy metal atoms which are diffused into the body of the chin 10, and will be preferably fixed in the damage sites at the $N^+/P^+$ interface (12/11). This causes a leaky junction and reduces switching loss and increases switching speed but the precise location of collection sites reduces the increase of forward voltage drop due to lifetime killing.

In accordance with a further feature of the invention, the lattice at the junction between $N^+$ region 12 and $P^+$ body 11 is preferably selectively damaged by implanting germanium atoms into the silicon lattice at the $N^+/P^+$ interface. The implant of germanium into the silicon lattice causes a uniform damage effect due to the lattice mismatch between the germanium and silicon in the monocrystal.

The implantation of germanium is in the range of $1\times10^{13}$ to $10^{15}$ per $cm^2$ at 50–150 Kev.

One process which can be used to implant the germanium is to first form the $P^+$ monocrystalline body 11. Germanium is then implanted uniformly over the exposed upper surface of $P^+$ body 11 and is then diffused into the upper $P^+$ surface to a depth of from 1 to 5 microns. Thereafter, the $N^+$ layer 12 is epitaxially grown, or otherwise formed on the upper surface of the germanium-rich layer of $P^+$ layer 11. Finally, the $N^-$ epitaxial layer is grown atop $N^+$ buffer layer 12.

The resulting structure will enable a more uniform distribution of lifetime killing atoms. Further, the use of germanium should reduce the forward voltage drop by approximately 150 mv.

The surface of the $P^+$ body can also be intentionally damaged by other processes than the use of a germanium implant. For example, intentional damage can be caused by implantation of argon or boron into the $P^+$ collector before forming the $N^+$ buffer layer.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An IGBT chip having an $N^+$ silicon buffer layer atop a P type silicon body; the top of said P type body having a top surface with intentional lattice damage, and heavy metal lifetime killing atoms disposed in and being preferentially located in the intentionally damaged lattice.

2. The chip of claim 1 which includes a germanium enriched silicon layer disposed between said P type body and said $N^+$ buffer layer.

3. The chip of claim 1 wherein said silicon body has an increased $P^+$ concentration.

4. The chip of claim 2 wherein said silicon body has an increased $P^+$ concentration.

5. The chip of claim 3 which includes a germanium enriched silicon layer disposed between said P type body and said $N^+$ buffer layer.

6. An IGBT chip having an $N^+$ buffer layer disposed above a P type body and a germanium enriched layer disposed between and in contact with said P type body and said $N^+$ buffer layer; and heavy metal atoms disposed within and adjacent to said germanium enriched layer.

7. The IGBT chip of claim 6 wherein said body has an increased $P^+$ concentration.

8. The IGBT chip of claim 6 wherein said germanium enriched layer consists of about 1% germanium and about 99% silicon.

9. The IGBT chip of claim 8 wherein said P type body has an increased $P^+$ concentration.

10. In an IGBT chip having a silicon P type body having top and bottom surfaces, a collector contact layer fixed to said bottom surface of said P type body, an $N^+$ silicon buffer layer disposed atop said P type silicon body, an epitaxially deposited $N^+$ layer disposed atop said $N^+$ buffer layer, at least one P type base region diffused into the top of said $N^+$ layer, an $N^+$ emitter region diffused into said P type base region to define a channel region, an MOS gate structure disposed above said channel region and an emitter contact disposed above and in contact with said emitter region; the improvement which comprises a region of intentional damage of the lattice of said P type body at its said top surface to define accurately located lifetime killing sites in said lattice.

11. The IGBT chip of claim 10 wherein said region of intentional damage includes a germanium enriched layer of silicon disposed between said P type body and said $N^+$ buffer layer and heavy metal atoms positioned at and uniformly distributed over the damaged lattice region.

12. The IGBT chip of claim 11 wherein said germanium enriched layer consists of about 1% germanium and about 99% silicon.

13. The IGBT chip of claim 1 wherein said P type body has an increased $P^+$ concentration.

14. The IGBT chip of claim 13 wherein said region of intentional damage includes a germanium enriched layer of silicon disposed between said P type body and said $N^+$ buffer layer and heavy metal atoms positioned at and uniformly distributed over the damaged lattice region.

15. The IGBT chip of claim 14 wherein said germanium enriched layer consists of about 1% germanium and about 99% silicon.

* * * * *